(12) United States Patent
Aoki et al.

(10) Patent No.: US 12,488,979 B2
(45) Date of Patent: Dec. 2, 2025

(54) LAMINATION WAFERS AND METHOD OF PRODUCING BONDED WAFERS USING THE SAME

(71) Applicant: GLOBALWAFERS JAPAN CO., LTD., Niigata (JP)

(72) Inventors: Tatsuhiko Aoki, Niigata (JP); Manabu Hirasawa, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 902 days.

(21) Appl. No.: 17/623,639

(22) PCT Filed: Jul. 27, 2020

(86) PCT No.: PCT/JP2020/028689
§ 371 (c)(1),
(2) Date: Jun. 9, 2022

(87) PCT Pub. No.: WO2021/020340
PCT Pub. Date: Feb. 4, 2021

(65) Prior Publication Data
US 2022/0319835 A1 Oct. 6, 2022

(30) Foreign Application Priority Data
Jul. 31, 2019 (JP) .................................. 2019-140880

(51) Int. Cl.
*H01L 21/02* (2006.01)
*H01L 23/00* (2006.01)

(52) U.S. Cl.
CPC .. *H01L 21/02035* (2013.01); *H01L 21/02013* (2013.01); *H01L 21/02021* (2013.01);
(Continued)

(58) Field of Classification Search
CPC ......... H01L 21/02035; H01L 21/02013; H01L 21/02021; H01L 24/08; H01L 24/80
See application file for complete search history.

(56) References Cited

U.S. PATENT DOCUMENTS

2009/0203167 A1* 8/2009 Mitani .............. H01L 21/76256
438/106
2013/0186853 A1* 7/2013 Sugimoto ............. G02F 1/1341
216/23
(Continued)

FOREIGN PATENT DOCUMENTS

JP 2005116614 A 4/2005
JP 2010263084 A 11/2010
(Continued)

OTHER PUBLICATIONS

International Search Report (PCT/ISA/210) with an English translation, and Written Opinion (PCT/ISA/237) mailed on Sep. 8, 2020, by the Japanese Patent Office as the International Searching Authority for International Application No. PCT/JP2020/028689. (10 pages).

*Primary Examiner* — Christine A Enad
(74) *Attorney, Agent, or Firm* — BUCHANAN INGERSOLL & ROONEY PC

(57) ABSTRACT

The occurrence of breaking and chipping at the wafer peripheral edge of a bonded wafer obtained by bonding a lamination wafer on a support wafer is suppressed. A lamination wafer to be bonded to a support wafer includes a large-diameter portion made of a silicon wafer whose peripheral edge is chamfered and a small-diameter portion, whose diameter is smaller than that of the large-diameter portion, formed on the large-diameter portion concentrically and integrally with the large-diameter portion, and the small-diameter portion includes a straight body portion whose side surface is perpendicular to the wafer surface, and a neck portion whose side surface is oblique with a prede-
(Continued)

termined angle to the wafer between the straight body portion and the large-diameter portion, and the small-diameter portion is formed such that the upper face of the straight body portion is to be bonded to the support wafer.

3 Claims, 5 Drawing Sheets

(52) U.S. Cl.
CPC .............. *H01L 24/08* (2013.01); *H01L 24/80* (2013.01); *H01L 2224/08245* (2013.01); *H01L 2224/80894* (2013.01)

(56) References Cited

U.S. PATENT DOCUMENTS

| | | |
|---|---|---|
| 2014/0054748 A1 | 2/2014 | Liu |
| 2016/0343564 A1 | 11/2016 | Indyk et al. |
| 2020/0135566 A1* | 4/2020 | Aketa .................. H01L 21/683 |

FOREIGN PATENT DOCUMENTS

| | | |
|---|---|---|
| JP | 2015076549 A | 4/2015 |
| JP | 2018182144 A | 11/2018 |
| JP | 2018182146 A | 11/2018 |
| TW | 509990 B | 11/2002 |
| TW | 200425222 A | 11/2004 |
| TW | 200631068 A | 9/2006 |
| TW | 201612948 A | 4/2016 |

\* cited by examiner

LAMINATION WAFERS AND METHOD OF PRODUCING BONDED WAFERS USING THE SAME

TECHNICAL FIELD

The present invention relates to lamination wafers and a method of producing bonded wafers using the same, more specifically to a lamination wafer that is hard to break or chip during production processes of stacked devices and a method for producing bonded wafers using the lamination wafer.

BACKGROUND ART

There have been methods of fabricating three-dimensional devices by forming bonded wafers laminated with a plurality of semiconductor wafers.

As shown in FIG. 6A, in a bonded wafer 30, for example, a lamination wafer 32 having a substantially same thickness as a supporting wafer of lower layer is laminated on the supporting wafer 31. (Bonded with a silicon dioxide film or adhesive agent.)

As shown in FIG. 6A, each of the supporting wafer 31 and the lamination wafer 32 is chamfered. For better heat dissipation or making lamination possible of a further semiconductor wafer (not shown) thereon, a process of thinning by grinding the bonded wafer 32 from the above (from the surface) is applied.

Because the cross-section of the peripheral edge, or chamfered edge, of a lamination wafer before the grinding process is formed to have a trapezoidal or fan shape, as shown in FIG. 6A, ground the lamination wafer 32 to be thin, the peripheral edge has an acute-edged shape like a knife blade, as shown in FIG. 6B; this causes a problem subject to easily chipping. If the bonded wafer is chipped, a crack develops from it, and there may be a problem that the bonded wafer is degraded and unusable.

For the above issues, a patent literature 1 discloses, as shown in FIG. 7: a first semiconductor wafer 41 (corresponding to the lamination wafer) is laminated to a second semiconductor wafer 42 (corresponding to the supporting wafer), and a processing method of thinning by grinding the upper surface of a second semiconductor wafer is applied, after the peripheral edge of the second semiconductor wafer 42 is removed by rotating the bonded wafers.

As a method of removing the peripheral edge of the second semiconductor wafer 42, there is a method of grinding that the peripheral edge of the second semiconductor 42 is removed by lowering a grinding stone 43 rotating at high revolution speed having a whetstone 43a on its periphery, as shown in FIG. 7 and by pressing the whetstone 43a.

CITATION LIST

Patent Literature

PTL-1: JP-A-2005-116614

SUMMARY OF INVENTION

Technical Problem

Using the method disclosed in PTL-1, the periphery (a beveled portion) of the second semiconductor wafer 42 (corresponding to the lamination wafer) can avoid becoming a knife-blade shape.

However, the attempt to remove only the peripheral edge of the second semiconductor wafer 42 by lowering the grinding stone 43 with rotating at high revolution speed may cause to damage the underlying first semiconductor wafer 41. This method is problematic in that it is not easy technically.

When the above processing is performed, a deep crushed layer may subject to occur on the processed surface; this may cause to generate contamination and crack in the device manufacturing process thereafter.

This invention is made to aim at providing a lamination wafer that is hard to break or chip during a production process of stacked devices and a method for producing bonded wafers using the lamination wafer, suppressing occurrence of breaking or cracking at the periphery of the lamination wafer that is bonded to the support wafer to form a bonded wafer.

Solution to Problem

A lamination wafer to be bonded to a support wafer has features that the lamination wafer has a large-diameter portion made of a silicon wafer whose peripheral edge is chamfered, and a small-diameter portion, smaller in diameter than the large-diameter portion, is formed on the large-diameter portion concentrically and integrally with the large-diameter portion; the small-diameter has a straight body portion whose side surface is perpendicular to the wafer surface, and a neck portion, between the straight body portion and the large-diameter portion, whose side surface is oblique with a predetermined angle to the wafer; and the upper face of the straight body portion is bonded to the support wafer.

For the bonded wafer using thus composed lamination wafer, because the peripheral side surface of the lamination wafer on the support wafer is substantially perpendicular to the support wafer surface, no knife-edged shape at the corner of the peripheral edge is made, and the occurrence of cracking or chipping can be avoided. As a result, degradation of semiconductor wafer quality can be suppressed.

A method to solve the above problem according to the present invention is producing bonded wafers that are prepared by bonding a lamination wafer to a support wafer and then grinding to a thin wafer, and the method has features including a first step of bonding the upper face of the straight body to the support wafer, a second step of removing the large-diameter portion by grinding, and a third step of removing the neck portion having a small diameter by grinding.

When let the thickness of the lamination wafer after the first step in which the large-diameter portion is removed by grinding denote T1, the thickness of the lamination wafer after the second step in which the small-diameter neck portion is removed denote T2, and the length from the peripheral edge of the large-diameter portion along the radial direction denote W1, before the second step in which the large-diameter portion is removed by grinding, the height A of the small-diameter portion at the lamination wafer is desirably formed such that $T1 \leq A \leq 300$ μm, the distance B along the radial direction between the peripheral edges of the small-diameter portion and the large-diameter portion is formed such that $W1 \leq B \leq w1+20$ μm and the height at the neck portion C is formed such that $0 \leq C$ and $T2 \leq A-C$.

Further, before the first step in which the upper face of the straight body is bonded to the support wafer, the tilting angle θ of the side surface of the neck portion of the lamination wafer to the wafer surface is desirably formed in a range of $45° \leq \theta \leq 90°$.

Or, before the first step in which the upper face of the straight body is bonded to the support wafer, the angle θ of the side surface of the neck portion of the lamination wafer to the wafer surface is desirably formed in a range of $90° < \theta \leq 110°$.

As described above, when bonded wafers are manufactured using the lamination wafers, grinding processing is easily performed in the first step of the grinding process because only the larger-diameter portion is removed that is disposed over the small-diameter portion and has a diameter larger than that of the small-diameter portion. Further, in the second step, no acute-edged-shaped portion is formed because the upper portion of the small-diameter portion is the neck portion whose periphery having a predetermined oblique angle to the wafer surface, and resultantly occurrence of breaking and chipping of the wafer is avoided.

Advantageous Effects of Invention

According to the present invention, as a lamination wafer to be joined onto a support wafer to form a bonded wafer, it is possible to provide the lamination wafer capable of suppressing the occurrence of cracks and chips at the peripheral end of the wafer and to provide a method for producing the bonded wafer using the lamination wafer.

DESCRIPTION OF EMBODIMENTS

Lamination wafers according to the present invention and the manufacturing method thereof will be described below. The lamination wafer according to the present invention will be used after thinned by grinding in the thickness direction after having been bonded to a supporting wafer.

Figure 1:
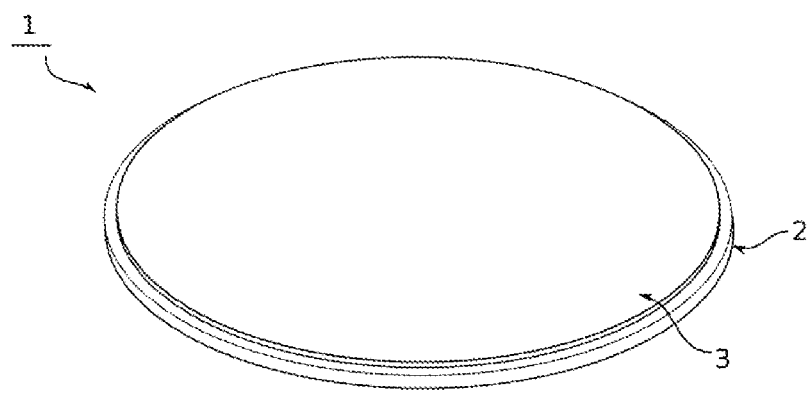
FIG. 1 is a perspective view of an embodiment of a lamination wafer according to the present invention.
Figure 2:
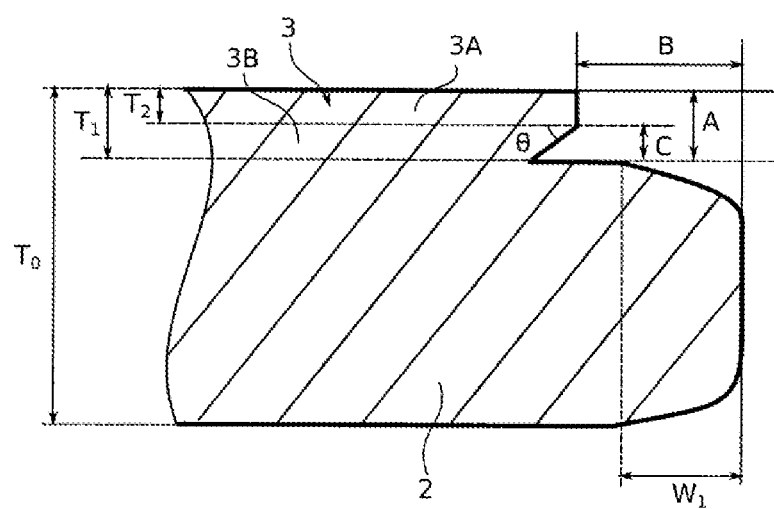
FIG. 2 is an enlarged cross-sectional view of the periphery (beveled portion) of the lamination wafer recited in FIG. 1.

FIG. 1 is a perspective view schematically illustrating an embodiment of the lamination wafer according to the present invention. FIG. 2 is an enlarged cross-sectional view of the periphery (beveled portion) of the lamination wafer recited in FIG. 1. In the following description, the upper side of the lamination wafer 1 shown in FIG. 1 is hereinafter called a front surface and the lower surface thereof a backside surface.

The lamination wafer 1 shown in FIG. 1 is composed of a silicon wafer and has a large-diameter portion 2 as the backside surface and a small-diameter portion 3 as the front surface; the small-diameter portion 3 is formed on the large-diameter portion 2 concentrically.

As shown in FIG. 2, the upper face of the large-diameter portion 2 and the lower face of the small-diameter portion 3 are connected and formed integrally.

The peripheral edge of the front surface and the backside surface of the large-diameter portion 2 is formed to a chamfered trapezoid in cross-sectional view (arc-shaped at the corners).

Further, the small-diameter portion includes a thinned straight body portion 3A which forms the front surface and whose side face is perpendicular to the wafer surface and a neck portion 3B formed between the straight body portion 3A and the large-diameter portion 2; the peripheral surface of the neck portion is tilted to the wafer surface with a predetermined angle θ as shown in FIG. 1.

Further, as shown in FIG. 2, the peripheral edge of the large-diameter portion 2 projects outside in radial direction compared to the peripheral edge of the small-diameter portion 3, and the thickness of the large-diameter portion 2 is formed to be thicker than that of the small-diameter portion 3.

The reason for making such a shape is that the grinding for wafer thinning is performed gradually. This allows easy thinning without causing breaking.

That is, when bonded wafers are manufactured, the front surface of the lamination wafer 1, or the front surface of the small-diameter portion, is bonded to the support wafer (not shown); this is in an upside-down state in FIGS. 1 and 2. Grinding is performed stepwise; the large-diameter portion 2 is removed in the first step, and the neck portion 3B is removed in the second step.

Now the shape of the lamination wafer before the grinding process is described in detail. As shown in FIG. 2, the thickness A (step height) is formed in a range of $T1 \leq A \leq 300$ μm, where T1 denotes the thickness of the lamination wafer 1 after the first step of grinding. This allows avoiding breaking and chipping of the periphery of the thinned lamination wafer 1. Further, when the thickness A becomes larger than 300 μm, the periphery of the large-diameter portion of the lamination wafer becomes too thin; this causes it subject to break and chip at the beveled portion during the process.

Further, at the periphery edge of the large-diameter portion 2 shown in FIG. 2, when W1 denotes the width of the beveled portion, or the radial length of the chamfered portion, the length B in the radial direction from the peripheral edge of the small-diameter portion 3 to the peripheral edge of the large-diameter portion 2 is formed such that $W1 \leq B \leq W1+20$ μm. By satisfying this condition, it is possible to prevent the wafer diameter after thinning from becoming too small and facilitate processing into the desired bevel shape.

As shown in FIG. 2, the height C of the neck portion 3B is formed to meet the condition that $0 \leq C$ and $T2 \leq A-C$, where T2 denotes the thickness of the lamination wafer 1 after the second step of grinding.

The tilting angle θ of the neck portion 3B to the wafer surface is formed in the range of $45° \leq \theta \leq 90°$ or $90° < \theta \leq 110°$.

When $45° \leq \theta \leq 90°$, breaking and chipping of the periphery edge of the thinned lamination wafer can be avoided. Further, when the lamination wafer 1 is bonded to a support wafer by thermal bonding processing, a bonding failure at the edge portion can be prevented due to the improved thermal dissipation efficiency at the region.

When $90° < \theta \leq 110°$, the outer surface of the lamination wafer 1 thinned by the second step of grinding is substantially perpendicular to the support wafer without being a knife-edged shape, and this allows preventing occurrence of breaking and chipping.

Further, the effect of lowering metal contamination levels at the peripheral edge of wafers (the beveled portion) is obtainable because a chemical solution is hard to stagnate at the region of interest at the time of wafer cleaning.

The reason is as follows: the chemical solution entering the recessed area is hard to be replaced, i.e., hard to be cleaned, for the case that $45°≤θ≤90°$, that is, the neck portion is acute-angle, and on the other hand, the flow of the chemical solution is hard to stagnate, or the chemical solution is easily replaced, for the case $90°<θ≤110°$, where the face of the neck portion is substantially perpendicular to the surface of the wafer.

The thickness dimension of the large-diameter portion 2 may be 675 μm, for example, but not particularly specified.

Figure 3:
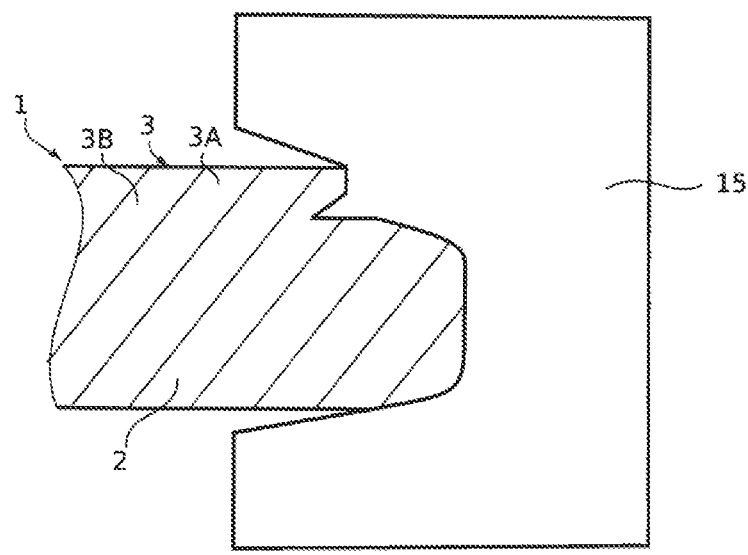
FIG. 3 is a cross-sectional view of a state where the periphery of the lamination wafer is being ground with a whetstone for bevel grinding.

To manufacture wafers of such a shape, it is enough to prepare a whetstone 15 for beveling having a shape corresponding to the targeted bevel shape in advance as shown in FIG. 3 and only to grind the wafer periphery with the whetstone for beveling 15 while revolving the lamination wafer 1 at high speed around the central axis.

Figure 4A:
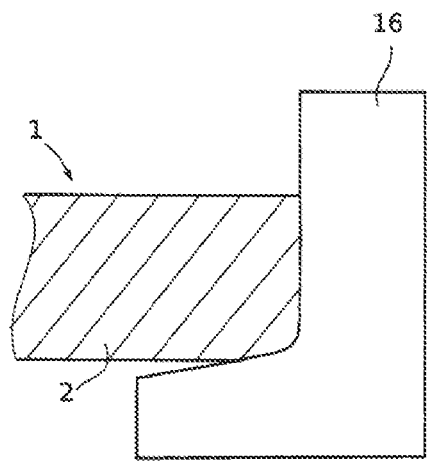
FIGS. 4A and 4B are cross-sectional views of a state where the periphery of a bonded wafer is being ground with another whetstone for bevel grinding.
Figure 4B:
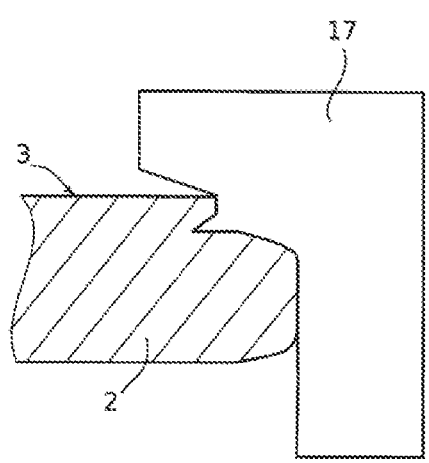

Alternatively, as shown in FIG. 4A, it is to grind only the backside periphery of the lamination wafer with a whetstone 16 having a shape corresponding to the backside shape of the lamination wafer 1, which is the lower peripheral shape of the backside of the large-diameter portion 2. Then, as shown in FIG. 4B, the peripheral edge of the front surface of the wafer may be only ground with a whetstone 17 for beveling that has a shape corresponding to the front surface shape of the lamination wafer 1, which is the shape from the side of the large-diameter portion 2 to the periphery of the small-diameter portion 3.

Followingly processes to manufacture the bonded wafers 20 using the lamination wafers 1 having such a shape will be described with reference to FIGS. 5A through 5C.

Figure 5A:
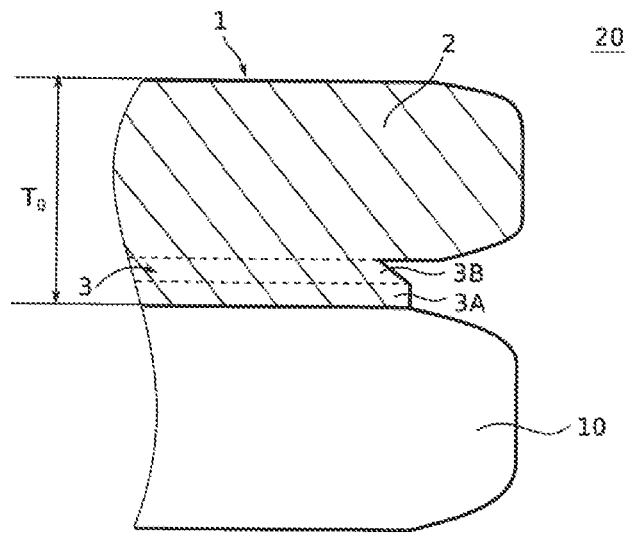
FIGS. 5A, 5B, and 5C are cross-sectional views that illustrate the process of manufacturing the bonded wafers using lamination wafers according to the present invention.

Firstly, as shown in FIG. 5A, the front surface of a lamination wafer (the surface of the small-diameter portion 3) is bonded to contact with the surface of a support wafer 10 with a silicon dioxide film having a thickness of a few tens of nanometer or an adhesive (resin). This makes the backside face of the lamination wafer 1 (backside of the large-diameter portion) comes to be the upside face of the bonded wafer 20. Here, T0 denotes the thickness of the lamination wafer 1, and is 775 μm, for example.

Figure 5B:
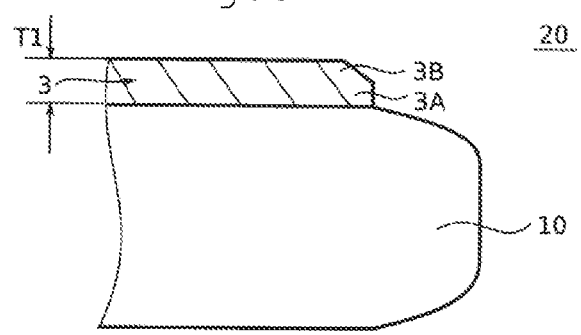
Figure 5C:
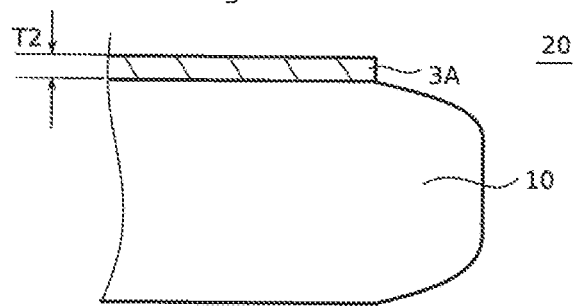
Figure 6A:
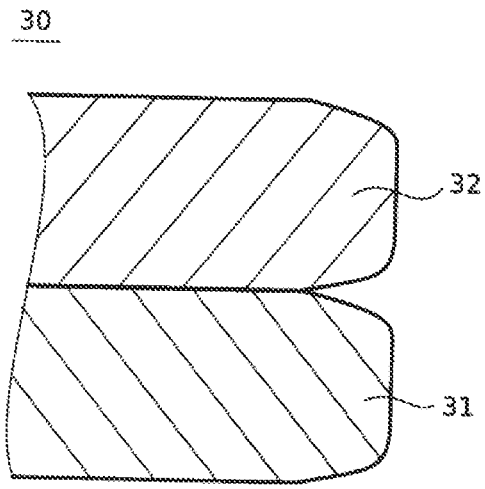
FIGS. 6A and 6B are cross-sectional views for illustrating the problems of conventional bonded wafers.
Figure 6B:
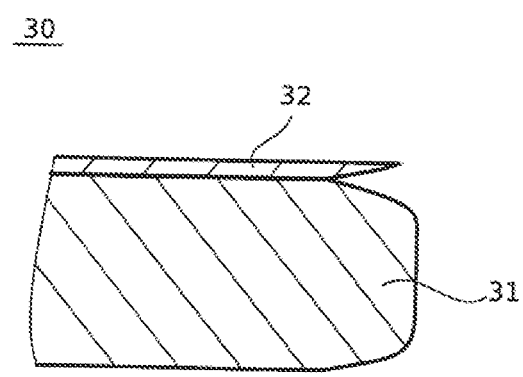
Figure 7:
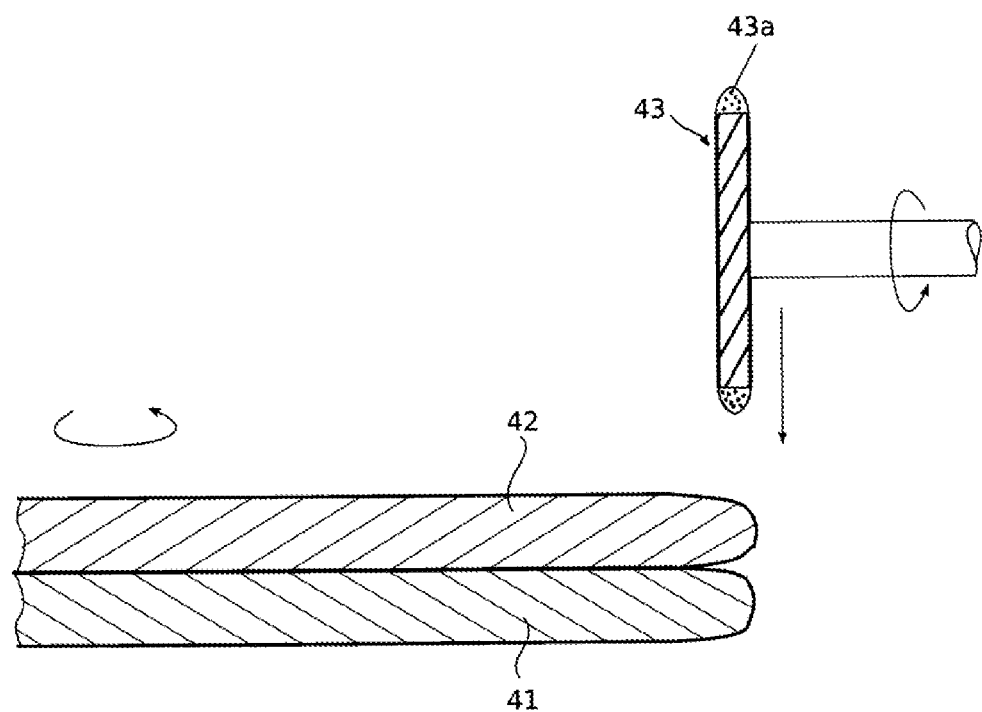
FIG. 7 is a cross-sectional view for illustrating the manufacturing method of the conventional bonded wafers.

As the first step of the grinding process, lamination wafer 1 is ground up to a target value T1, 100 μm, for example, from the above and the uppermost part of the large-diameter portion is removed as shown in FIG. 5B. In the first step of the grinding process as described above, since it is a process of removal by grinding the large-diameter portion 2, formed on the small-diameter portion 3, which has a larger diameter than the small-diameter portion 3, the grinding process is easily performed.

In the second step, the small-diameter portion 3 on the support wafer 10 is ground from the above up to a target value of T2, 5 μm, for example, to remove the neck portion 3B. This results in the lamination wafer 1 having only a thin straight body portion 3A. In the second step of grinding, no knife-edges portion is formed because the small-diameter portion 3 has the neck portion 3B whose side is oblique with a predetermined angle to the wafer surface, even when the oblique part of the neck portion 3B remains after the grinding process or is ground up to the straight body portion 3A.

With the bonded wafer 20 formed with the lamination wafer 1 according to the present embodiment, since the side face of the peripheral edge of the lamination wafer on the support wafer 10 is perpendicular to the support wafer, the edge portion of the periphery is not acute-angled and capable of preventing the occurrence of breaking and chipping. As a result, the degradation in the quality of the semiconductor wafers can be suppressed.

In the process of forming the bonded wafers 20 using the lamination wafers 1, the grinding process is performed easily in the first step because only the large-diameter portion 2 is removed, which has a larger diameter than that of the smaller diameter portion 3 and is disposed on the small-diameter portion 3. In the second step, because the upper portion of the small-diameter portion is the neck portion 3B having an oblique angle, the grinding up to the straight body portion 3A is easy; this prevents the formation of the acute-angle edge and the occurrence of breaking and chipping.

EXAMPLES

The lamination wafers according to the present invention and the method of producing bonded wafers using the lamination wafers will be described based on the examples.

In the examples, silicon wafers having a diameter of 300 mm and a thickness of 775 μm (T0) were produced, and lamination wafers were made by machining the peripheries of the wafers under the conditions set in Examples 1 to 8, and Comparative Examples 1 to 7.

Then, the lamination wafers were bonded to support wafers with silicon dioxide film having a thickness of 80 nm. Grinding was performed stepwise for thinning based on the examples described above.

For each condition, the target value T0 of the stepwise grinding for the lamination wafers is 775 μm as the initial value, the target value T1 after the first step is 100 μm, and the target value T2 after the second step is 5 μm. The projection length W1 along the radial direction at the peripheral edge (the beveled portion) of the large-diameter portion is set to 390 μm One thousand (1000) samples were tested in each experiment, Examples 1 to 8 and Comparative Examples 1 to 7. Parameters A, B, C, and θ shown in FIG. 2 were set as conditions. Table 1 shows the conditions and results of Examples 1 to 8 and Comparative Examples 1 to 7.

In Table 1, the evaluation items of "Breaking and Chipping of the Beveled Portion" are indicated by "Good" when breaking and chipping did not occur and by "No Good" when they did occur.

"Breaking and Chipping of the Beveled Portion" includes breaking and chipping of the peripheral edge of the large-diameter portion that occur during the grinding process of the lamination wafers. The evaluation item "Bonding Failure" is indicated by "Excellent" when bonding failure between the lamination wafer and the support wafer occurs, by "Fair" when the occurrence rate is less than 1%, and by "Poor" when for the occurrence rate is 1% or higher. Further, the evaluation item of "Metal contamination" is indicated by "Excellent" when the degree of contamination is better than the one at the conventional beveled portion of wafers, and by "Fair" when it is equivalent to that of the conventional one. Products with metal contamination evaluated by "Excellent" and "Fair" are determined as "non-defective".

TABLE 1

| | A (μm) | B (μm) | C (μm) | θ (degree) | Breaking and chipping of beveled portion | Bonding Failure | Metal Contamination |
|---|---|---|---|---|---|---|---|
| Example 1 | 150 | 400 | 100 | 70 | Good | Excellent | Fair |
| Example 2 | 110 | 400 | 100 | 70 | Good | Excellent | Fair |
| Example 3 | 300 | 400 | 100 | 70 | Good | Excellent | Fair |
| Example 4 | 150 | 400 | 143 | 70 | Good | Excellent | Fair |
| Example 5 | 150 | 400 | 100 | 45 | Good | Excellent | Fair |
| Example 6 | 150 | 400 | 100 | 110 | Good | Fair | Excellent |
| Example 7 | 150 | 390 | 100 | 70 | Good | Excellent | Fair |
| Example 8 | 150 | 410 | 100 | 70 | Good | Excellent | Fair |
| Comparative Example 1 | 90 | 400 | 90 | 70 | No Good | Excellent | Fair |
| Comparative Example 2 | 310 | 400 | 100 | 70 | No Good | Excellent | Fair |
| Comparative Example 3 | 150 | 380 | 100 | 70 | No Good | Excellent | Fair |
| Comparative Example 4 | 150 | 420 | 100 | 70 | No Good | Excellent | Fair |
| Comparative Example 5 | 150 | 400 | 147 | 70 | No Good | Excellent | Fair |
| Comparative Example 6 | 150 | 400 | 100 | 70 | No Good | Excellent | Fair |
| Comparative Example 7 | 150 | 400 | 100 | 115 | No Good | Poor | Excellent |

In Example 1, parameters are set as follows:
T1 (=100 μm)<A (=150 μm),
W1 (=390 μm)<B (=400 μm),
A−C (=50 μm)>T2 (=5 μm), and θ=70°.
No breaking and chipping at the beveled portion and bonding failure occurred, and the metal contamination is rated "Fair".

In Example 2, parameters are set as follows:
T1 (=100 μm)<A (=110 μm),
W1 (=390 μm)<B (=400 μm),
A−C (=10 μm)>T2 (=5 μm), and
θ=70°.
No breaking and chipping at the beveled portion and bonding failure occurred, and the metal contamination is rated "Fair".

In Example 3, parameters are set as follows:
T1 (=100 μm)<(=300 μm),
W1 (=390 μm)<B (=400 μm),
A−C (=200 μm)>T2 (=5 μm), and
θ=70°.
No breaking and chipping at the beveled portion and bonding failure occurred, and the metal contamination is rated "Fair".

In Example 4, parameters are set as follows:
T1 (=100 μm)<A (=150 μm),
W1 (=390 μm)<B (=400 μm),
A−C (=7 μm)>T2 (=5 μm), and
θ=70°.
No breaking and chipping at the beveled portion and bonding failure occurred, and the metal contamination is rated "Fair".

In Example 5, parameters are set as follows:
T1 (=100 μm)<A (=150 μm),
W1 (=390 μm)<B (=400 μm),
A−C (=7 μm)>T2 (=5 μm), and
θ=70°.
No breaking and chipping at the beveled portion and bonding failure occurred, and the metal contamination is rated "Fair".

In Example 6, parameters are set as follows:
T1 (=100 μm)<A (=150 μm),
W1 (=390 μm)<B (=400 μm),
A−C (=50 μm)>T2 (=5 μm), and
θ=110°.
No breaking and chipping at the beveled portion and bonding failure occurred, and the metal contamination is rated "Excellent".

In Example 7, parameters are set as follows:
T1 (=100 μm)<A (=150 μm),
W1 (=390 μm)=B (=390 μm),
A−C (=50 μm)>T2 (=5 μm), and
θ=70°.
No breaking and chipping at the beveled portion and bonding failure occurred, and the metal contamination is rated "Fair".

In Example 8, parameters are set as follows:
T1 (=100 μm)<A (=150 μm),
W1 (=390 μm)<B (=410 μm),
A−C (=50 μm)>T2 (=5 μm), and
θ=70°.
No breaking and chipping at the beveled portion and bonding failure occurred, and the metal contamination is rated "Fair".

In Comparative Example 1, parameters are set as follows:
T1 (=100 μm)>A (=90 μm),
W1 (=390 μm)<B (=400 μm),
A−C (=0 μm)<T2 (=5 μm), and
θ=70°.
No bonding failure occurred, and the metal contamination is rated "Fair", but breaking and chipping at the beveled portion occurred, since the peripheral edge of the wafer has a knife-edge shape because T1>A.

In Comparative Example 2, parameters are set as follows:
T1 (=100 μm)<A (=310 μm),
W1 (=390 μm)<B (=400 μm),
A−C (=210 μm)<T2 (=5 μm), and
θ=70°.
No bonding failure occurred, and the metal contamination is rated "Fair", but breaking and chipping at the beveled portion occurred. When A is greater than 300 μm, then the periphery of the large-diameter portion of the lamination wafer becomes too thin. Such a value of A is not desirable because breaking and chipping at the beveled portion is subject to occur during machining.

In Comparative Example 3, parameters are set as follows:
T1 (=100 µm)<A (=150 µm),
W1 (=390 µm)>B (=380 µm),
A–C (=50 µm)>T2 (=5 µm), and
θ=70°.
No bonding failure occurred, and the metal contamination is rated "Fair", but breaking and chipping at the beveled portion occurred. It should be noted that machining becomes difficult and the wafer may have the risk of getting damaged.

In Comparative Example 4, parameters are set as follows:
T1 (=100 µm)<A (=150 µm),
W1 (=390 µm)<B (=420 µm),
A–C (=50 µm)>T2 (=5 µm), and
θ=70°.
No bonding failure occurred, and the metal contamination is rated "Fair", but breaking and chipping at the beveled portion occurred. If B is equal to W1+20 µm or greater, the small-diameter portion of the wafer becomes too small and there may be a risk of falling from the wafer transfer carrier.

In Comparative Example 5, parameters are set as follows:
T1 (=100 µm)<A (=150 µm),
W1 (=390 µm)<B (=400 µm),
A–C (=3 µm)<T2 (=5 µm), and
θ=70°.
No bonding failure occurred, and the metal contamination is rated "Fair", but breaking and chipping at the beveled portion occurred. When A–C becomes less than T2, breaking and chipping at the beveled portion is subject to occur because the oblique portion at the neck portion remains.

In Comparative Example 6, parameters are set as follows:
T1 (=100 µm)<A (=150 µm),
W1 (=390 µm)<B (=400 µm),
A–C (=50 µm)>T2 (=5 µm), and
θ=70°.
No bonding failure occurred, and the metal contamination is rated "Fair", but breaking and chipping at the beveled portion occurred. When θ is less than 45°, machining of the peripheral edge of the wafer becomes difficult, and defects may be subject to occur.

In Comparative Example 7, parameters are set as follows:
T1 (=100 µm)<A (=150 µm),
W1 (=390 µm)<B (=400 µm),
A–C (=50 µm)>T2 (=5 µm), and
θ=115°.
Metal contamination is rated "Fair", but bonding failure, and breaking and chipping at the beveled portion occurred. When θ is greater than 115°, the peripheral edge of the wafer may become a knife-edged shape.

From the results above, it is confirmed that the present invention is effective by setting the condition:
T1≤A≤300 µm
W1≤B≤W1+20 µm,
θ≤C and T2≤A–C, and 45°≤θ≤90° or 90°<θ≤110°.

LIST OF REFERENTIAL SIGNS 1 lamination wafer
2 large-diameter portion
3 small-diameter portion
3A straight body portion
3B neck portion
10 support wafer
20 bonded wafer

What is claimed is:

1. A lamination wafer, which is to be bonded to a support wafer and thinned by grinding, to form a bonded wafer, comprising:
a large-diameter portion whose peripheral edge is chamfered, which forms a backside surface of the lamination wafer; and
a small-diameter portion, smaller in diameter than that of the large-diameter portion, formed on the large-diameter portion concentrically and integrally with the large-diameter portion, which forms a front surface of the lamination wafer;
wherein the large-diameter portion and the small-diameter portion constitute a single, integral silicon wafer;
the small-diameter portion comprising
a straight body portion whose side surface is perpendicular to the wafer surface; and
a neck portion disposed between the straight body portion and the large-diameter portion, wherein the neck portion has a peripheral surface that is tilted to the wafer surface at a tilting angle θ in a range of 45°≤θ<90°,
wherein the small-diameter portion is formed such that the upper face of the straight body portion is to be bonded to the support wafer.

2. A method of producing a bonded wafer that is prepared by bonding the lamination wafer recited in claim 1 to the support wafer and then grinding the lamination wafer to be thin,
the method comprising:
a step of bonding the upper face of the straight body to the support wafer,
a step of removing the large-diameter portion by grinding, and
a step of removing the neck portion of the small-diameter portion by grinding,
wherein, before the step of bonding the upper face of the straight body the support wafer, a tilting angle θ of a peripheral surface of the neck portion to the wafer surface is set to be in a range of 45°≤θ<90°.

3. The method of producing the bonded wafers recited in claim 2, comprising steps of:
setting the height A of the small-diameter portion of the lamination wafer to be T1≤A≤300 µm;
setting the distance B along the radial direction between the peripheral edges of the small-diameter portion and the large-diameter portion to be W1≤B≤w1+20 µm; and
setting the height C of the neck portion to be 0≤C and T2≤A–C,
before the step of bonding the upper surface side of the straight body portion onto the supporting wafer,
where the thickness dimension of the bonded wafer after the step of grinding and removing the large-diameter portion is T1, the thickness of the lamination wafer after the step in which the small-diameter neck portion is removed by grinding is T2, and the length from the peripheral edge of the large-diameter portion along the radial direction is W1.

* * * * *